(12) United States Patent
Murakami

(10) Patent No.: US 7,678,412 B2
(45) Date of Patent: Mar. 16, 2010

(54) SEALANT DRAWING METHOD, SEALANT DRAWING APPARATUS, AND METHOD AND APPARATUS FOR MANUFACTURING LIQUID CRYSTAL DEVICE

(75) Inventor: Chihiro Murakami, Shiojiri (JP)

(73) Assignee: Seiko Epson Corporation (JP)

( * ) Notice: Subject to any disclaimer, the term of this patent is extended or adjusted under 35 U.S.C. 154(b) by 550 days.

(21) Appl. No.: 11/301,756

(22) Filed: Dec. 13, 2005

(65) Prior Publication Data

US 2006/0141131 A1 Jun. 29, 2006

(30) Foreign Application Priority Data

Dec. 27, 2004 (JP) ............... 2004-375689

(51) Int. Cl.
*B05D 5/12* (2006.01)
(52) U.S. Cl. .................................... 427/58
(58) Field of Classification Search .......... 141/1, 141/67; 349/157, 155, 153, 56; 427/58, 427/66–68, 256, 284; 118/300, 323
See application file for complete search history.

(56) References Cited

U.S. PATENT DOCUMENTS

| | | | | |
|---|---|---|---|---|
| 5,808,719 | A * | 9/1998 | Fujiwara et al. ............ | 349/157 |
| 5,932,012 | A * | 8/1999 | Ishida et al. ................ | 118/669 |
| 6,940,576 | B2 * | 9/2005 | Imayama et al. ............ | 349/153 |
| 6,982,777 | B2 * | 1/2006 | Lai et al. ..................... | 349/153 |
| 2005/0112283 | A1 * | 5/2005 | Chae et al. .................. | 427/258 |

FOREIGN PATENT DOCUMENTS

| | | | |
|---|---|---|---|
| EP | 1600809 A1 * | 11/2005 | |
| JP | 2001-183681 | 7/2001 | |
| JP | 2002-079160 | 3/2002 | |
| JP | 2003-142816 | 5/2003 | |
| JP | 2004-146841 | 5/2004 | |
| JP | 2004-290885 | 10/2004 | |
| WO | WO 2004/074919 | * 2/2004 | |

* cited by examiner

*Primary Examiner*—Michael Cleveland
*Assistant Examiner*—Robert Vetere
(74) *Attorney, Agent, or Firm*—Harness, Dickey & Pierce, P.L.C.

(57) ABSTRACT

A sealant drawing method is provided in which patterns for sealing an electro-optic material over a plurality of panel formation regions on a substrate are drawn by discharging sealant on the substrate from a nozzle of a coating unit, and which includes forming continuously first patterns on the plurality of panel formation regions in a batch manner, so as to form parts of the individual patterns in the plurality of panel formation regions; and forming continuously second patterns on the plurality of panel formation regions in a batch manner, so as to form the remainders of the individual patterns in the plurality of panel formation regions.

7 Claims, 8 Drawing Sheets

SEALANT DRAWING METHOD, SEALANT DRAWING APPARATUS, AND METHOD AND APPARATUS FOR MANUFACTURING LIQUID CRYSTAL DEVICE

BACKGROUND

1. Technical Field

The present invention relates to a sealant drawing method, to a sealant drawing apparatus, and to a method and apparatus for manufacturing liquid crystal devices, and in particular, to a manufacturing technology suitable to a case where sealant with a high viscosity is used.

2. Related Art

In general, in the process of manufacturing liquid crystal devices, a panel structure in which two substrates are adhered together using sealant and a liquid crystal material is enclosed therebetween is constructed. This manufacturing process includes a sealant coating process of forming a liquid crystal material enclosure region that contains a liquid crystal material by coating the sealant in such a way as to surround electrode patterns, such as transparent electrodes formed on an inner surface of the substrate. In the sealant coating method in this process, a screen-printing method has been widely used, especially, in the case where sealant having a low viscosity can be used.

However, the screen-printing method is problematic in that nonconformity sometimes occurs since the screen is brought in contact with the inner surface of the substrate. To avoid this problem, there has been proposed a method of drawing a desired pattern on the substrate by discharging the sealant from a nozzle using a dispenser.

In a method using a dispenser, a dispenser is generally used in which sealant is stored in a syringe and a nozzle having a discharge port is provided at the tip of the syringe. The dispenser generally has a construction in which the sealant is mechanically pushed out by an extrusion rod inserted into the syringe, a construction in which the sealant is pushed out by means of the pressure of air supplied into the syringe, and the like. Furthermore, in a method of pushing out sealant by means of air pressure, it is difficult to uniformly discharge sealant having a high viscosity. To avoid this problem, it is conceivable to provide a sealant drawing method using a dispenser through control of a servomotor as a method of discharging sealant (see, e.g., JP-A-2004-290885).

In the case of manufacturing a liquid crystal device by drawing sealant having a high viscosity, as in JP-A-2004-290885, however, if the drawing start position and the drawing end position of the sealant overlap each other, a defective cell gap is likely to occur due to the thickness of the sealant. In addition, since each sealant needs to be formed to surround the liquid crystal material enclosure region, the drawing start and the drawing end have to be performed according to the number of corresponding liquid crystal material enclosure regions. Therefore, it is difficult to draw the sealant in a short period of time.

SUMMARY

An advantage of some aspects of the invention is that it provides a sealant drawing method and a sealant drawing apparatus, in which drawing can be efficiently performed with a simplified control system. Another advantage of some aspects of the invention is that it provides a method and apparatus for manufacturing high-quality liquid crystal devices, which can realize a uniform cell gap even when sealant having a high viscosity is used, at low cost.

According to a first aspect of the invention, a sealant drawing method is provided in which patterns for sealing an electro-optic material over a plurality of panel formation regions on a substrate are drawn by discharging sealant on the substrate from a nozzle of a coating unit, and which includes forming continuously first patterns on the plurality of panel formation regions in a batch manner, so as to form parts of the individual patterns in the plurality of panel formation regions; and forming continuously second patterns on the plurality of panel formation regions in a batch manner, so as to form the remainders of the individual patterns in the plurality of panel formation regions.

In the method, the formation of the first patterns and the formation of the second patterns can be preferably carried out in a direction in which the plurality of panel formation regions is arranged.

Furthermore, each panel formation region may refer to a region of which a part is formed by the first pattern and the remainder is formed by the second pattern.

Furthermore, the term "the first patterns are continuously formed in a batch manner" or "the second patterns are continuously formed in a batch manner" may refer to that the first patterns or the second patterns are formed in such a manner that the plurality of panel formation regions and the coating unit are relatively moved while the sealants are continuously discharged from the nozzle of the coating unit from the drawing start position to the drawing end position.

In such a case, the sealant can be formed in a batch manner in a direction in which the plurality of panel formation regions is arranged through a single process from the drawing start to the drawing end of the first patterns and a single process from the drawing start to the drawing end of the second patterns.

Meanwhile, in the case where the sealant is formed in each of the plurality of panel formation regions, the drawing start and the drawing end of the sealant have to be performed on each of the regions, and the drawing start and the drawing end have to be repeatedly performed on the plurality of panel formation regions, accordingly. Therefore, since discharging and non-discharging of the sealants are continuously generated, it becomes difficult to stably flow the sealants within the coating unit, which may lead to variation in the amount of sealant that is discharged. In addition, since the coating unit has to be scanned on a first basic material or a second basic material, the operation of the coating unit becomes complicated.

In the invention, however, the first patterns and the second patterns can be drawn and formed in a continuous way and in a batch manner in the direction in which the plurality of panel formation regions is arranged. Therefore, drawing can be started and ended for every column or row of each of the plurality of panel formation regions, and the drawing start number and the drawing end number can be reduced accordingly. This makes it possible to continuously draw the first patterns and the second patterns in a batch manner while the sealing material within the coating unit is made to flow stably. It is also possible to draw sealant in a short period of time. In addition, in a single process from the drawing start to the drawing end of the first patterns and a single process from the drawing start to the drawing end of the second patterns, the coating unit does not scan the plurality of panel formation regions in a non-discharge state, whereby the sealing material filled into the coating unit can be prevented from inadvertently dropping. Therefore, the operation of the coating unit can be simplified and the coating unit can also be easily controlled. It is thus possible to prohibit variation in the viscosity or in a discharge amount of the sealing material. In addition, since it is not necessary to take into consideration of the variation in viscosity between lots of the sealing material, the shape of the sealing materials can be easily managed. Furthermore, since the sealant can be drawn easily and quickly, a drawing method with improved productivity can be realized.

Furthermore, in the sealant drawing method, it is preferable that the formation of the first patterns and the formation of the second patterns be performed in opposite directions.

In this case, there is a tendency that bead-shaped drawing pools are likely to generate at the drawing start position due to a larger amount of sealant being discharged from the nozzle as compared with a discharge state. Furthermore, in the case where the formation of the first patterns and the formation of the second patterns are performed in the same direction, drawing pools at drawing start positions become noticeable profound because the drawing start positions are the same. Therefore, the thickness of the sealant on the panel formation region increases.

In addition, if such a drawing gathering phenomenon is generated between a panel formation region and a counter substrate opposite to the panel formation region, a predetermined cell gap cannot be obtained when the panel formation region and the counter substrate are adhered. Furthermore, in the case of sealant having a high viscosity, variation in a cell gap is increased as compared with sealant having a low viscosity.

In accordance with the invention, however, the formation of the second patterns is performed in the opposite direction to a direction in which a drawing is performed in the formation of the first patterns. Therefore, a desired cell gap can be obtained by distributing bead-shaped drawing pools that occur when drawings begin in the same direction.

Furthermore, in the sealant drawing method according to the first aspect of the invention, in the formation of the first patterns and the formation of the second patterns, it is preferable that coordinate values for which the sealant is discharged be calculated before the sealant is discharged on the plurality of panel formation regions, and the sealant be discharged on the plurality of panel formation regions on the basis of the calculated coordinate values.

Through this construction, a coordinate value of each of the plurality of panel formation regions can be calculated before the sealant is discharged. The sealant can be discharged on the plurality of panel formation regions on the basis of the calculated coordinate values and the first patterns and the second patterns can be drawn accordingly. In addition, in the case where the entire coordinate values of the plurality of panel formation regions are calculated in a batch manner and the sealant is discharged in a batch manner on the basis of the entire coordinate values, it is unnecessary to calculate the coordinate values during the discharge.

Furthermore, in the sealant drawing method according to the first aspect of the invention, in the formation of the first patterns and the formation of the second patterns, preferably, first coordinate values for which the sealant is coated on first panel formation regions of the plurality of panel formation regions are calculated before the sealant is discharged on the first panel formation regions, and the sealant is discharged on the first panel formation regions on the basis of the calculated first coordinate values.

The first panel formation regions refer to regions that is formed first among the plurality of panel formation regions. Furthermore, the first coordinate values refer to coordinate data calculated before the first panel formation regions are formed.

In such a case, the first coordinate values can be calculated before the sealant is discharged on the first panel formation region. In addition, the sealant can be discharged on the first panel formation region on the basis of the calculated first coordinate value, whereby the first patterns or the second patterns can be drawn.

Furthermore, in the sealant drawing method according to the first aspect of the invention, in the formation of the first patterns and the formation of the second patterns, preferably, second coordinate values for which the sealant is coated on second panel formation regions are calculated while the sealant is discharged on first panel formation regions of the plurality of panel formation regions, and the sealant is discharged on the second panel formation regions on the basis of the second coordinate values after the sealant is discharged on the first panel formation regions.

In this case, the first panel formation regions and the second formation regions do not refer to specific regions of the plurality of panel formation regions. However, regions formed soon after the first panel formation regions in the formation process are defined as the second panel formation regions. In other words, in two arbitrary panel formation regions of the plurality of panel formation regions, a region that is relatively formed first is defined as the first panel formation region, and a region that is relatively formed thereafter is defined as the second panel formation region. In addition, the second coordinate value refers to coordinate data calculated before the second panel formation region is formed.

Through this construction, while the sealant is discharged on the first panel formation regions, the second coordinate values can be calculated. Furthermore, after the sealant is discharged on the first panel formation regions, it can be discharged on the second panel formation regions on the basis of the second coordinate values. Therefore, the sealant can be continuously discharged on the plurality of panel formation regions, whereby the first pattern or the second pattern can be drawn. In addition, multipoint teaching data are unnecessary as compared with a case where all of the coordinate values of the plurality of panel formation regions are calculated and the sealant is discharged on the basis of the all of the calculated coordinate values.

Furthermore, according to a second aspect of the invention, a sealant drawing apparatus is provided which draws patterns for sealing an electro-optic material on a substrate having a plurality of panel formation regions by discharging sealant on the substrate from a nozzle of a coating unit and which includes a movement unit that moves the coating unit and the substrate in a relative way; and a control unit that controls the coating unit and the movement unit. In the sealant drawing apparatus, drawing is performed by the above-mentioned sealant drawing method.

In this case, the control unit has the function of executing an operating process on the basis of a program according to input or stored data. Therefore, the control unit can control the discharge operation of the coating unit, the movement operation or the position decision operation of the movement unit, etc. according to a corresponding program or data. Furthermore, the sealant drawing apparatus of the invention has the same effects as the drawing method since it performs the sealant drawing method.

Therefore, the sealant can be continuously drawn in a batch manner in a direction, in which the plurality of panel formation regions is arranged, by a single process from the drawing start to the drawing end of a first pattern and a single process from the drawing start to the drawing end of a second pattern. Further, drawing can be started and ended for every column or row of the plurality of panel formation regions, and the drawing start number and the drawing end number can be reduced accordingly. This makes it possible to continuously draw the first pattern and the second pattern, while the sealant stably flows within the coating unit. It is also possible to draw the sealant in a short period of time. In addition, in a single process from the drawing start to the drawing end of a first pattern and a single process from the drawing start to the drawing end of a second pattern, the coating unit does not scan a plurality of panel formation regions in a non-discharge state. It is thus possible to prevent the sealing material filled into the coating unit from inadvertently dropping. Therefore, the operation of the coating unit can be simplified and the coating unit can also be easily controlled. It is thus possible to prohibit variation in the viscosity or in the discharge amount of the sealing material. In addition, since it is unnecessary to take into consideration of variation in viscosity between lots of the sealing material, the shape of the sealing material can be easily managed. Since the sealant can be drawn easily and quickly, a drawing method with improved productivity can be realized.

Furthermore, in the sealant drawing apparatus according to the second aspect of the invention, preferably, the coating unit is plural, and a sealant from each of the plurality of coating units is discharged on the substrate.

Through this construction, a plurality of first patterns or a plurality of second patterns can be drawn at the same time. This makes it possible to improve the productivity as compared with a case where only one coating unit is used.

Furthermore, according to a third aspect of the invention, a method of manufacturing a liquid crystal device is provided which includes drawing a sealant by discharging the sealant on a plurality of panel formation regions on a first substrate basic material; filling the inside of the sealant with liquid crystal; adhering the first substrate basic material and a second substrate basic material opposite to the first substrate basic material with the liquid crystal interposed therebetween; and dividing the first and second substrate basic materials into the plurality of panel formation regions. In the manufacturing method, the above-mentioned sealant drawing method is used for drawing the sealant.

Furthermore, according to a fourth aspect of the invention, a manufacturing apparatus of a liquid crystal device is provided which draws patterns for sealing an electro-optic material on a substrate having a plurality of panel formation regions by discharging sealant on the substrate from a nozzle of a coating unit, and which includes a movement unit that moves the coating unit and the substrate in a relative way; and a control unit that controls the coating unit and the movement unit. In the manufacturing apparatus, drawing is performed by the above-mentioned sealant drawing method.

Through this apparatus, the same effects as those of the sealant drawing method can be obtained. In addition, in the case where a sealant is formed in each of a plurality of panel formation regions as in the related art, the drawing start and the drawing end of the sealant must be performed on each region. In the invention, however, sealants can be continuously drawn on a plurality of panel formation regions in a batch manner. Therefore, liquid crystal devices can be fabricated at low cost through the improvement of the productivity. Liquid crystal devices, which are void of the defective cell gap, having a high quality display can be fabricated.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a sealant drawing method, a sealant drawing apparatus, and a method and apparatus for manufacturing liquid crystal devices according to the invention will be described in detail in connection to embodiments with reference to the accompanying drawings.

Sealant Drawing Apparatus

Figure 1:
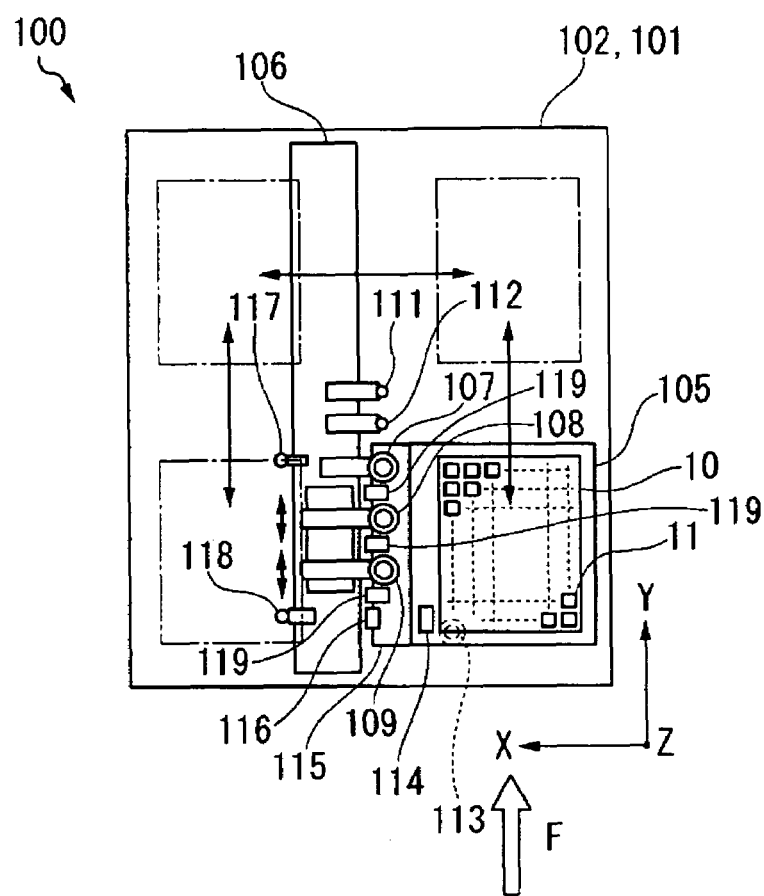
FIG. 1 is a schematic plan view showing the entire construction of a sealant drawing apparatus according to the invention.
Figure 2:
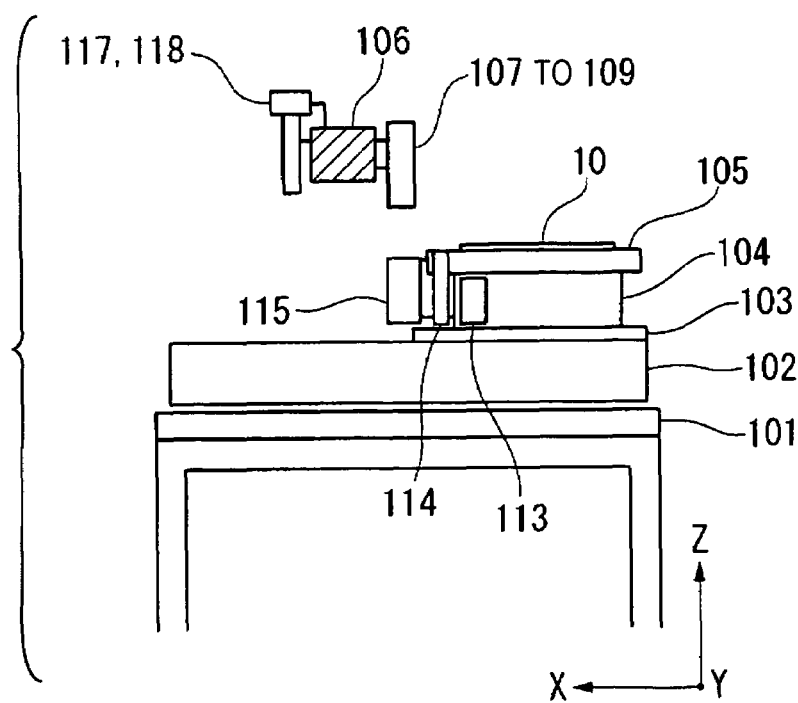
FIG. 2 is a schematic plan view showing the disposition of the sealant drawing apparatus in a height direction according to the invention.
Figure 3A:
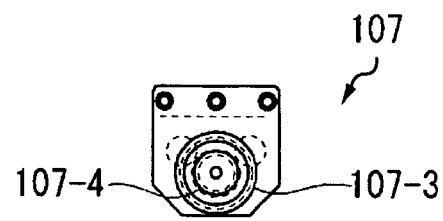
FIG. 3A is a view showing an encoder and a decelerator of a dispenser in the sealant drawing apparatus according to the invention.
Figure 3B:
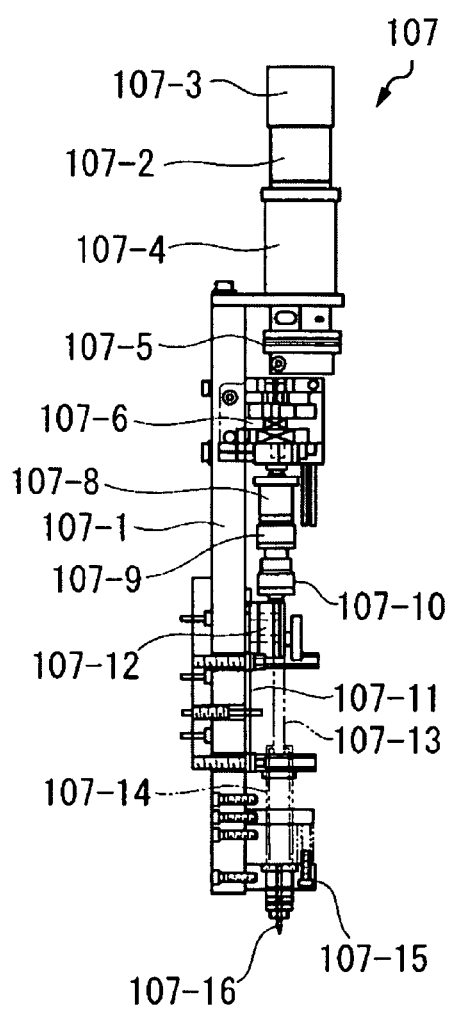
FIG. 3B is a view showing the structure of the dispenser in the sealant drawing apparatus according to the invention.
Figure 3C:
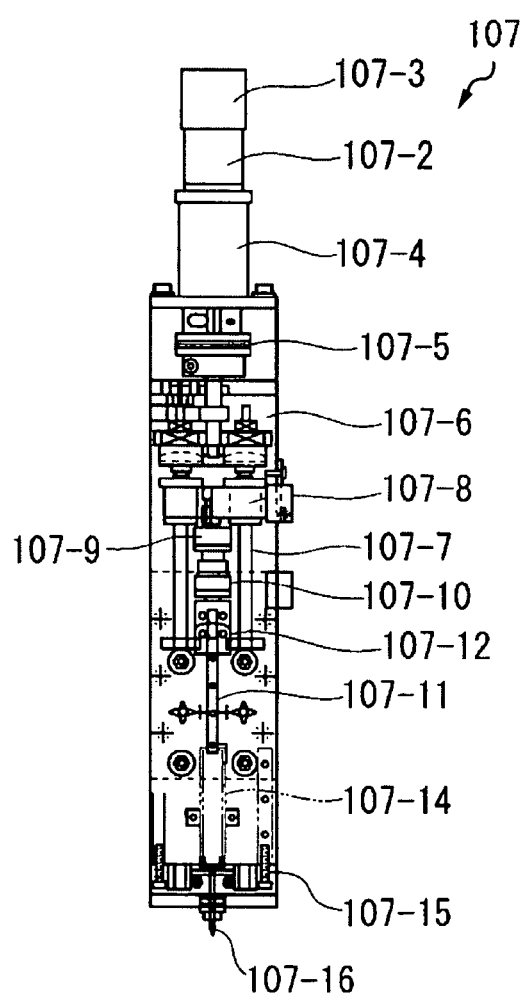
FIG. 3C is another view showing the structure of the dispenser in the sealant drawing apparatus according to the invention.
Figure 3D:
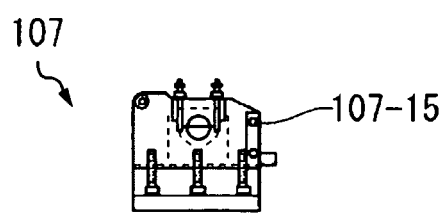
FIG. 3D is a view showing a support plate of the dispenser in the sealant drawing apparatus according to the invention.

FIG. 1 is a schematic plan view showing a sealant drawing apparatus (a manufacturing apparatus of a liquid crystal device) according to an embodiment of the invention. FIG. 2 is a schematic explanatory view showing the arrangement construction of each of the elements of the apparatus in a height direction.

In the sealant drawing apparatus 100, an XY drive mechanism 102 (movement unit) is fixed to a support frame 101. An XY movement stage 103 (movement unit) is disposed to move on the XY drive mechanism 102 in a horizontal direction (i.e., an X direction and a Y direction). A θ drive mechanism 104 (movement unit) is fixed on the XY movement stage 103. A support table 105, which is adapted to rotate around a vertical axis by means of the θ drive mechanism 104 (θ rotation operation), is disposed on the θ drive mechanism 104. The XY drive mechanism 102, the XY movement stage 103, and the θ drive mechanism 104 constitute the movement mechanism of the support table 105.

A substrate (a first substrate basic material) 10, such as a glass substrate, is supplied on the support table 105 in the direction of the arrow F shown in FIG. 1. The substrate 10 is fixed on the support table 105 by a suction method, etc. A plurality of panel schedule areas 11 is arranged in advance on the substrate 10. Conductor patterns that constitute electrodes or wiring lines, such as transparent conductors, are formed on these panel schedule areas 11.

A column 106 is fixed over the support table 105. The column 106 has dispensers (coating units) 107, 108, and 109 mounted thereon. A distance between these dispensers 107 to 109 (a distance in the Y direction of the drawing) can be changed. Specifically, the dispenser 107 is mounted so as to be fixed to the column 106 in a horizontal direction. The dispensers 108 and 109 are mounted so as to be movable with respect to the column 106 in the horizontal direction (the Y direction of the drawing).

An adhesive coating unit 111 for coating an ultraviolet (UV) adhesive for temporarily fixing the substrate 10 or a liquid crystal drop unit 112 for dropping liquid crystal is also mounted in the column 106.

A nozzle alignment camera 113, which takes photographs of nozzles (not shown) of the dispensers 107 to 109 through the substrate 10 at a lower position, is also disposed on the support table 105. In addition, a linear gauge sensor 114 for setting the height of the nozzles is provided in the support table 105. A nozzle cleaning unit 115 is provided in the support table 105 under the column 106. The nozzle cleaning unit 115 functions so as to remove sealant adhered to the nozzles of the dispensers 107 to 109 or to accommodate unnecessary sealant discharged from the nozzles.

In the column 106 is mounted a linear gauge sensor 116 for detecting a thickness of the substrate 10. In the column 106 are also mounted cameras 117 and 118 for aligning the substrate 10. A detector 119 for measuring a surface height of the substrate 10, such as a laser displacement system, is further provided in each of the dispensers.

FIGS. 3A to 3D show the detailed construction of the dispensers 107 to 109. It should be understood that FIGS. 3A to 3D show only the dispenser 107 of the dispensers 107 to 109. The remaining dispensers 108 and 109 have the same construction as the dispenser 107, and will not be shown nor described, in order to avoid redundancy.

In the dispensers 107, a servo motor 107-2, an encoder 107-3 and a decelerator 107-4 are fixed with respect to a base plate 107-1. An output shaft of the decelerator 107-4 is introduced into a distributor 107-6 composed of a gear train through a coupling 107-5. The distributor 107-6 is adapted to rotate two screw shafts 107-7. A nut member 107-8 is screwed to these two screw shafts 107-7. The nut member 107-8 is coupled to a floating joint 107-10 through a load cell 107-9. The floating joint 107-10 is fixed to a drive block 107-12 guided into a guide member 107-11. The drive block 107-12 is coupled to an extrusion rod 107-13. The extrusion rod 107-13 is inserted into a syringe 107-14 from the topside. The syringe 107-14 is fixed to a support plate 107-15 that is fixed to the base plate 107-1. A nozzle 107-16 is mounted at the tip of the syringe 107-14.

Figure 4:
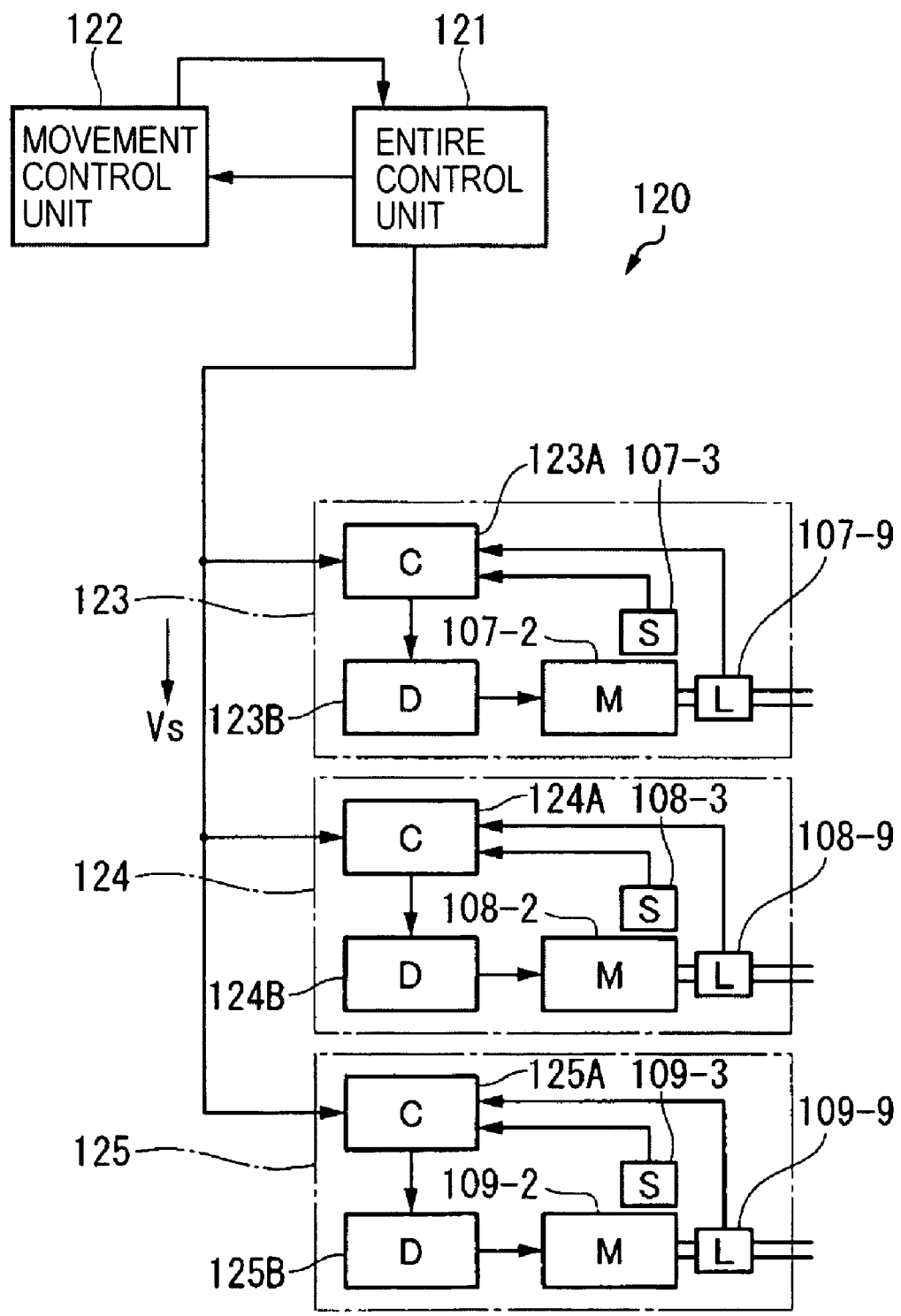
FIG. 4 is a schematic view showing the construction of a control system in the sealant drawing apparatus according to the invention.

FIG. 4 schematically shows the construction of a part of a control system 120 of the sealant drawing apparatus 100.

The control system 120 includes an entire control unit (control unit) 121 for controlling the entire system, and a movement control unit 122 that controls the movement mechanism (including the XY drive mechanism 102, the XY movement table 103, and the θ drive mechanism 104) for moving the substrate 10 according to an instruction received from the entire control unit 121.

The entire control unit 121 is a so-called computer having an operating circuit such as a central processing unit (CPU), a storage circuit such as a read only memory (ROM) or random access memory (RAM), an external storage device and so on. The entire control unit 121 executes an operating process on data stored in the storage circuit or the external storage device according to a program, and operates the movement control unit 122 or the coating control units 123 to 125 according to the operation result.

The movement control unit 122 is a movement unit for moving the substrate 10 so that sealant is coated on the circumference of the panel schedule areas 11. The movement control unit 122 outputs movement data of the substrate 10, i.e., movement data of the support table 105. The movement data can correspond to a control signal when the movement control unit 122 is operated through feedback control, or can be a movement detection value of the support table 105 that is controlled by the movement control unit 122. For example, the movement data can include position coordinates in the X direction and the Y direction, a drift speed in the x direction and the Y direction, etc., when the support table 105 is moved in the X direction and Y direction.

The entire control unit 121 determines a drawing speed Vs corresponding to the drift speed of the substrate 10 on the basis of the movement data and sends a signal corresponding to the drawing speed Vs to the coating control units 123 to 125. For example, in the case where position coordinates in the X direction and the Y direction are provided as movement data, the drawing speed Vs can be calculated on the basis of the rate of change of the position coordinates. Meanwhile, in the case where drift speed components in the X direction and the Y direction are provided as movement data, the magnitude of a vector, which is obtained by multiplying drift speed component vectors in the x direction and the Y direction, becomes the drawing speed Vs.

The coating control units 123, 124, and 125 are constructed to individually control coating amounts of the dispensers 107, 108, and 109, respectively. Controllers 123A, 124A, and 125A are provided in the coating control units 123, 124, and 125, respectively. The controllers 123A, 124A, and 125A output control signals to driving parts 123B, 124B, and 125B according to the drawing speed Vs, respectively. These driving parts 123B, 124B, and 125B drive driving sources (driving motors) 107-2, 108-2, and 109-2, respectively, which are provided in the corresponding dispensers. Position (speed) detectors (encoders) 107-3, 108-3, and 109-3 are disposed side-by-side in these driving sources. Position (speed) detection signals from the position (speed) detectors are fed back to the control units. Load detectors (load cells) 107-9, 108-9, and 109-9 detect an extrusion load when the extrusion rod 107-13 is driven by the driving sources 107-2, 108-3, and 109-2. The extrusion loads, which are detected by these load detectors, are fed back to the controllers.

The controllers 123A, 124A, and 125A generate target values of the extrusion loads according to the drawing speed Vs, and output control signals to the driving parts 123B, 124B, and 125B such that the extrusion loads detected by the load detectors 107-9, 108-9, and 109-9, respectively, are identical to the target values. In general, if the drawing speed Vs increases, the target value becomes high, and the extrusion speed increases such that the extrusion load increases. In addition, the target value of the extrusion load corresponding to the drawing speed Vs can be generated by setting a plurality of speed regions in the drawing speed Vs and selecting a target value, which is set in advance, for each speed region. The control state of each of the controllers 123A, 124A, and 125A can be set according to variation in a coating characteristic of the dispensers 107, 108, and 109. The controllers 123A, 124A, and 125A can have different control states.

In the present embodiment, the extrusion amount (the extrusion speed of the extrusion rod) is controlled on the basis of the extrusion load as described above. In the method of controlling the coating amount on the basis of the extrusion load, sealant is directly pressurized by means of the extrusion rod, and a load applied to the extrusion rod is detected. Therefore, this method is superior to the conventional method in that the response speed of the extrusion load is rarely lowered even though the viscosity of the sealant becomes high. In addition, by changing the target value of an extrusion load according to the drawing speed Vs of the dispenser, the sealant can be uniformly coated even if the drawing speed significantly varies.

The sealant drawing apparatus 100 as described above operates as follows.

If the substrate 110 is supplied on the support table 105 as shown by the arrow F of FIG. 1, the substrate 10 is approximately positioned on the support table 105 by using an appropriate position decision unit, such as a regulation member, or pusher, and is then fixed by a vacuum adsorption method, etc. The substrate 10 is then moved and the linear gauge sensor 116 detects the thickness of the substrate 10. The substrate 10 is then moved again and the cameras 117 and 118 perform alignment according to a location decision pattern formed on the substrate 10. At this time, for example, by processing images taken by the cameras 117 and 118, the movement mechanism (e.g., the θ drive mechanism 104) can adjust the support table 105 so that the substrate 10 has a predetermined position.

The height (i.e., the height of the nozzle), which is the position of the dispensers 107, 108, and 109 in the Z-axis direction, is then adjusted on the basis of the thickness of the substrate 10, which is detected by the linear gauge sensor 116. In this case, regarding the heights of the dispensers 107, 108, and 109, e.g., the position of the dispensers 107, 108 and 109 can be set with regard to the apparatus by using the linear gauge sensor 114, etc., in advance when the apparatus is driven (determine an origin).

If the above sequence is finished, the support table 105 is moved according to a desired pattern on which sealant will be drawn by the movement mechanism. At this time, the discharge rates of the sealants of the dispensers 107 to 109 can be respectively controlled by the coating control units 123 to 125 shown in FIG. 4. Specifically, a driving amount, i.e., an extrusion amount of the extrusion rod can be controlled in accordance with a target value of an extrusion load corresponding to the drawing speed Vs of each of the dispensers 107 to 109 for the substrate 10, which is generated according to a movement aspect of the support table 105 performed by the movement mechanism, and an extrusion load detected by the load detector. A coating amount provided by each of the dispensers 107 to 109 can be optimized accordingly.

In the sealant drawing apparatus 100, the substrate 10 is moved and drawing is carried out in synchronization with the plurality of dispensers. This may lead to an improved productivity. Furthermore, during the drawing, a coating amount of sealant is individually controlled for every dispenser. Therefore, the entire control system does not become complicated even though the plurality of dispensers is used. In other words, even though the number of dispensers increases, only one coating control unit is needed for all the dispensers. It is not necessary to change the construction of the control system of the entire apparatus.

Furthermore, since a coating amount of sealant is controlled on a dispenser-by-dispenser, there is an advantage in that variation due to a difference between the dispensers can be reduced. In the present embodiment, the reason why the dispensers 107 to 109, i.e., a plurality of sealant discharge units are individually controlled by the coating control units 123 to 125 is that the volume of a syringe, an aperture area of a discharge port of a nozzle, etc. are different for every dispenser and the control state can be adjusted with respect to each dispenser according to such variation.

The sealant drawing apparatus 100 is further adapted to push out sealant by using a mechanical extrusion unit (the extrusion rod) unlike the extrusion method using hydrostatic pressure. Therefore, the sealant can be pushed out regardless of the viscosity of the sealant. In addition, since a coating amount is controlled according to an extrusion load, coating accuracy can be obtained without being significantly influenced by the viscosity of sealant. An extrusion load can be detected in real time by using the mechanical extrusion method and control (load control) with high responsibility can be obtained.

(Sealant Drawing Method)

The sealant drawing method will be described below with reference to FIGS. 5 to 8.

Figure 5:
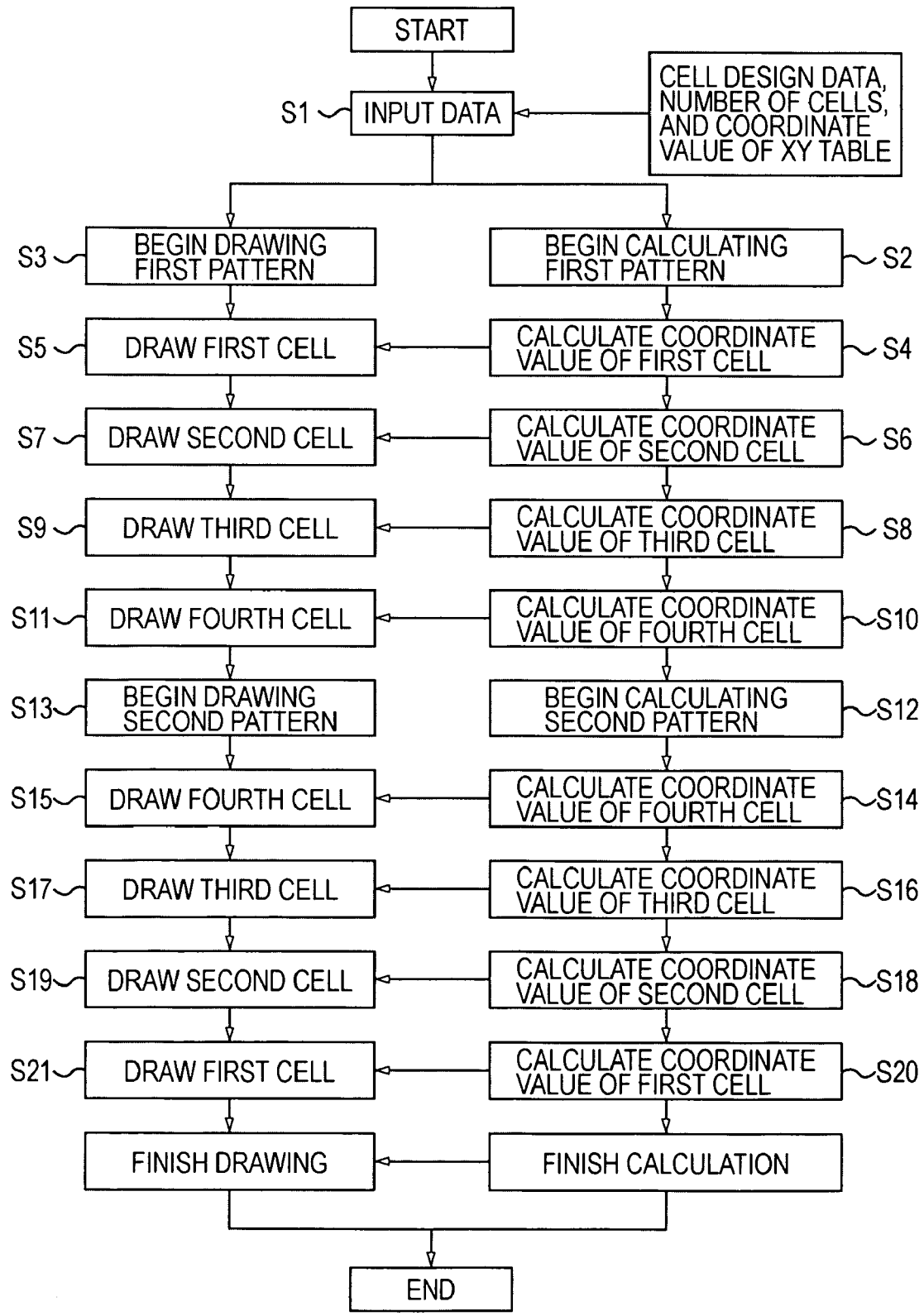
FIG. 5 is an operational flowchart for illustrating a sealant drawing method according to the invention.
Figure 6:
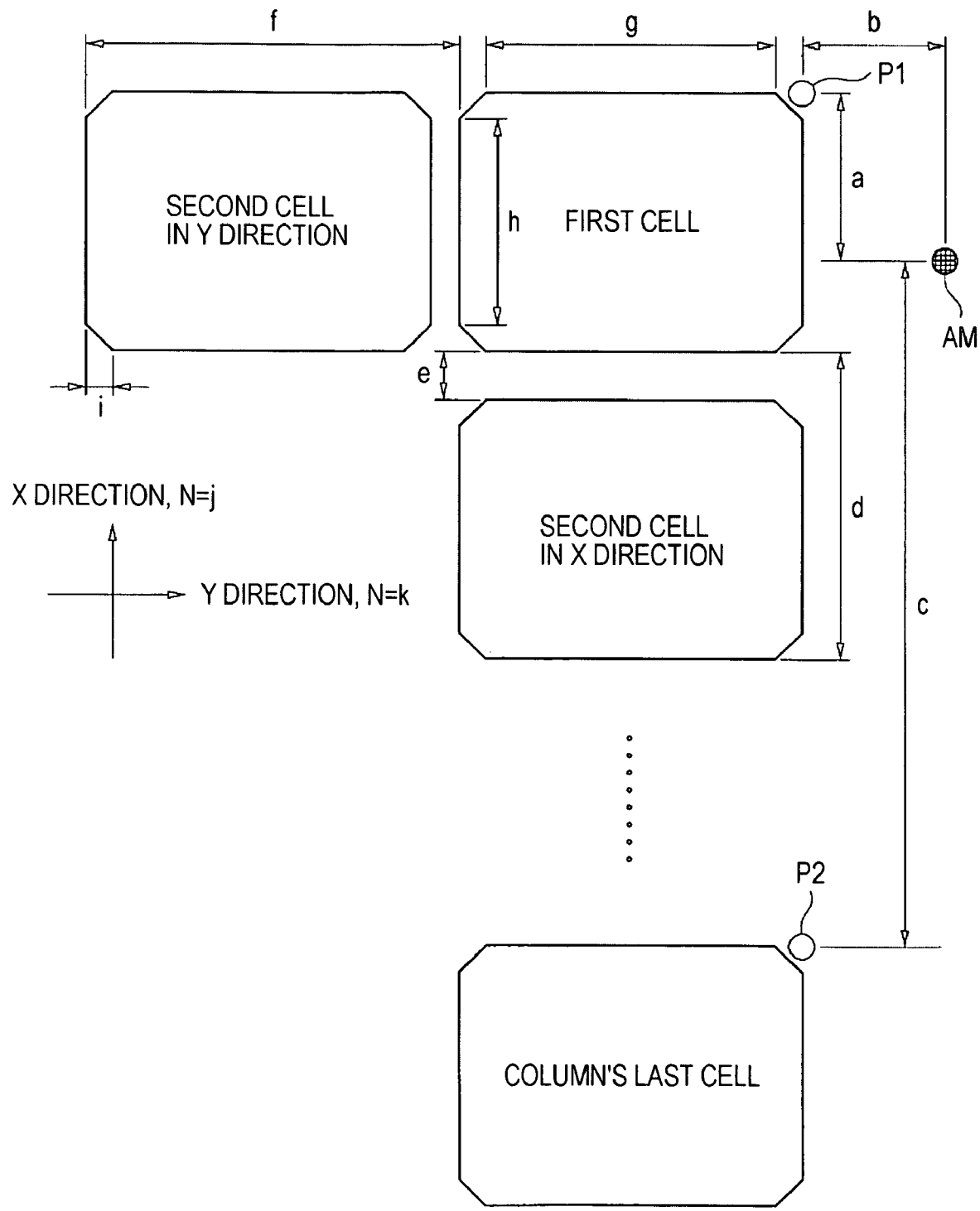
FIG. 6 is a view for illustrating input data in the sealant drawing method of the invention.
Figure 7:
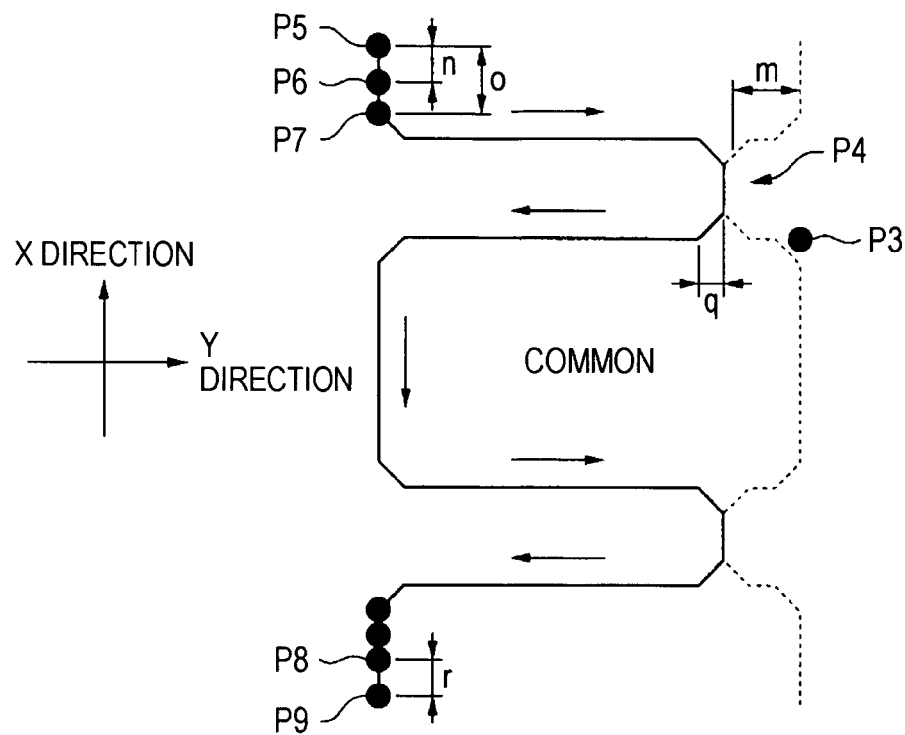
FIG. 7 is a view for illustrating input data in the sealant drawing method of the invention.
Figure 8:
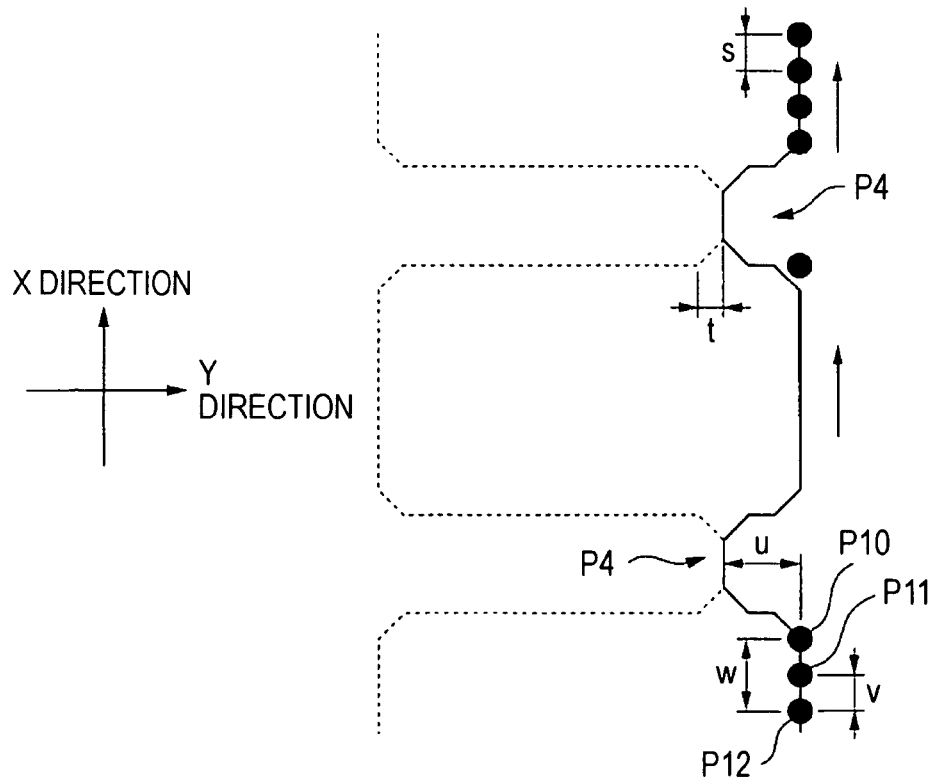
FIG. 8 is a view for illustrating input data in the sealant drawing method of the invention.
Figure 9A:
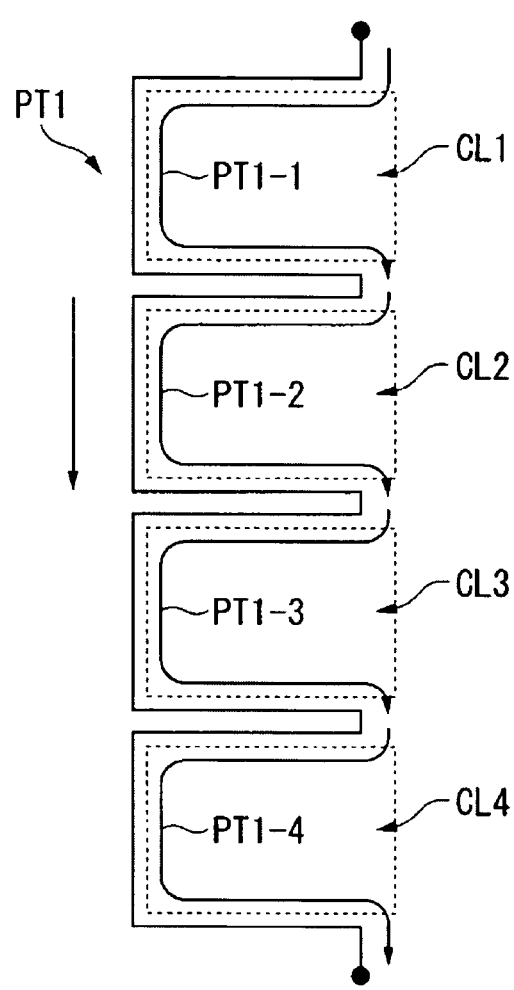
FIG. 9A is a view showing a first pattern that is drawn in the sealant drawing method of the invention.
Figure 9B:
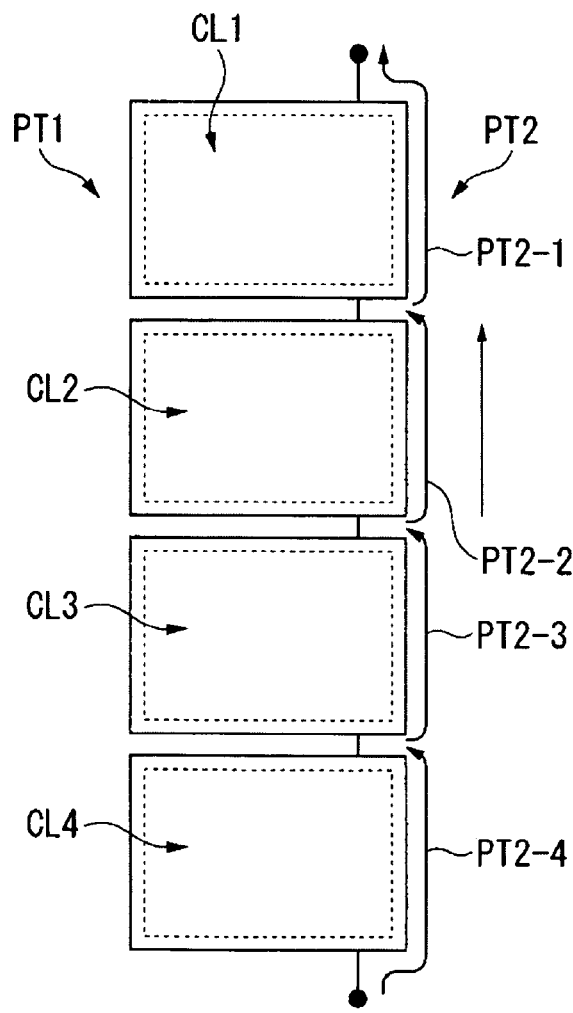
FIG. 9B is a view showing a second pattern that is drawn in the sealant drawing method of the invention.

FIG. 5 is an operational flowchart for illustrating the operation of the entire control unit. FIGS. 6 to 8 show data input to the entire control unit in the operational flowchart of FIG. 5. FIG. 9A shows a first pattern of sealant, which is formed according to the operational flowchart of FIG. 5. FIG. 9B shows a second pattern of sealant, which is formed according to the operational flowchart of FIG. 5.

A case where the first pattern and the second pattern are drawn on four cells (a panel formation region) will be described below. The present embodiment is, however, not limited to the present number of cells, but can include a higher number of cells. To assist in the understanding of the description, a case where the first pattern and the second pattern are formed by using only one dispenser, as shown in FIG. 9, will be described.

Referring first to FIG. 5, data are input to the entire control unit 121 at step S1. The input data can be cell design data, the number of cells, and a coordinate value of the XY table. Specifically, values are input to variables "a" to "j" shown in FIG. 6, variables "m" to "r" shown in FIG. 7, and variables "s" to "w" shown in FIG. 8.

Each of the variables shown in FIGS. 6 to 8 will be described.

In FIG. 6, the variables "a" and "b" are relative coordinate values from an alignment mark AM of the substrate 10 to a reference point P1 of a first cell in the X direction and the Y direction, respectively. The variable "c" is a relative coordinate value in the X direction and the Y direction from the alignment mark AM to a reference point P2 of a column's last cell in the X column direction. The variable "d" is a pitch between cells in the X column direction, and the variable "e" is a distance in the X column direction between a first cell and a second cell. Furthermore, the variable Off is a pitch between cells in the Y row direction. The variables "g" and "h" are lengths of each side of each cell in the Y direction and the X direction, respectively. Furthermore, the variable "i" is the dimension of a C chamfered part of each cell. The variables "j" and "k" are the number of cells formed on the substrate 10 in the X direction and the Y direction, respectively.

In FIG. 7, the variable "m" is a distance from a junction P4 between a first pattern and a second pattern to a reference point P3 of each cell in the Y direction. The variable "n" is a distance in the X direction between initial discharge regions P5 and P6 of the first pattern. The variable "o" is a distance in the X direction between the initial discharge region P5 of the first pattern and a C chamfered part P7. The variable "q" is the dimension of a C chamfered part between the junction P4 and a side of each cell in the Y direction of the first pattern. The variable "r" is a distance in the X direction between end regions P8 and P9 of the first pattern.

Furthermore, in FIG. 8, the variable "s" is a distance in the X direction between end regions P8 and P9 of the second pattern. The variable "t" is the dimension of a C chamfered part between a junction P4 and a side of each cell in the Y direction of the second pattern. The variable "u" is a distance in the Y direction between the junction P4 and a reference point of each cell. Furthermore, the variable "v" is a distance in the X direction between initial discharge regions P11 and P12 of the second pattern. The variable "w" is a distance in the x direction between the initial discharge point P12 of the second pattern and a C chamfered part P10.

In addition, each of data shown in FIGS. 6 to 8 is not limited to input data. For example, the data can be data stored in advance in the storage circuit of the entire control unit 121 or an external storage device.

A coordinate of the first pattern is calculated in the entire control unit 121 at step S2. Furthermore, at step S3, the drawing of the first pattern (the first pattern formation process) begins on the basis of the processing result at step S2.

At step S4, a coordinate value (a first coordinate value) of a first cell CL1 formed by the first pattern is calculated on the basis of the input data at step S1. As described above, the coordinate value of the first cell CL1 can be calculated before the first cell CL1 is drawn.

In addition, during the calculation of the coordinate value of the first cell CL1, the drawing operation is not performed.

The first cell CL1 is then drawn at step S5.

At step S5, the first cell CL1 is drawn on the basis of the coordinate value calculated at step S4. A part of the first cell CL1 is thus formed, as indicated by reference numeral PT1-1 in FIG. 9A. Furthermore, while the first cell CL1 is drawn, a coordinate value of a second cell CL2 to be formed by the first pattern PTL is calculated in the entire control unit 121 at step S6. At step S6, the coordinate value of the second cell CL2 is calculated on the basis of the data input at the previous step S1 and the coordinate value calculated at step S4.

The second cell CL2 is then drawn at step S7.

At step S7, the second cell CL2 is drawn on the basis of the coordinate value calculated at the previous step S6. A part of the second cell CL2 is thus formed, as indicated by reference numeral PT1-2 in FIG. 9A. Furthermore, while the second cell CL2 is drawn, a coordinate value of a third cell CL3 formed by the first pattern PT1 is calculated in the entire control unit 121 at step S8. At step S8, the coordinate value of the third cell CL3 is calculated on the basis of the data input at the previous step S1 and the coordinate value calculated at steps S4 and S6.

The third cell CL3 is then drawn at step S9.

At step S9, the third cell CL3 is drawn on the basis of the coordinate value calculated at the previous step S8. A part of the third cell CL3 is thus formed, as indicated by reference numeral PT1-3 in FIG. 9A. Furthermore, while the third cell CL3 is drawn, a coordinate value of a fourth cell CL4 formed by the first pattern PT1 is calculated in the entire control unit 121 at step S10. At step S10, the coordinate value of the fourth cell CL4 is calculated on the basis of the data input at the previous step S1 and the coordinate values calculated at steps S4, S6, and S8.

The fourth cell CL4 is then drawn at step S11.

At step S11, the fourth cell CL4 is drawn on the basis of the coordinate value calculated at the previous step S10. A part of the fourth cell CL4 is thus formed, as indicated by reference numeral PT1-4 in FIG. 9A.

The drawing of the first pattern PT1 is thereby completed.

In the drawing of the first pattern PT1, parts of the first cell CL1, the second cell CL2, the third cell CL3, and the fourth cell CL4 are sequentially formed. As described above, the first panel formation region refers to a region that is formed earlier than the second panel formation region in the formation process. Therefore, the first cell CL1 refers to the first panel formation region of the invention and the second cell CL2 refers to the second panel formation region of the invention in that the first cell CL1 is formed immediately before the second cell CL2. In this case, a coordinate value of the second cell CL2 refers to a second coordinate value in the invention.

Furthermore, the second cell CL2 refers to the first panel formation region of the invention and the third cell CL3 refers to the second panel formation region of the invention in that the second cell CL2 is formed immediately before the third cell CL3. In this case, a coordinate value of the third cell CL3 refers to a second coordinate value in the invention.

Furthermore, the third cell CL3 refers to the first panel formation region of the invention and the fourth cell CL4 refers to the second panel formation region of the invention in that the third cell CL3 is formed immediately before the fourth cell CL4. In this case, a coordinate value of the fourth cell CL4 refers to a second coordinate value in the invention.

Thereafter, a coordinate of the second pattern PT2 is calculated and the second pattern PT2 is drawn. In the present embodiment, a direction in which the first pattern PT1 is drawn and a direction in which the second pattern PT2 is drawn are opposite to each other. In other words, the first pattern PT1 is formed from the upper side to the lower side of the paper in FIG. 9A, whereas the second pattern PT2 is formed from the lower side to the upper side of the paper in FIG. 9B. Coordinate calculation and drawing of the second pattern PT2 will be described below.

A coordinate value of the second pattern PT2 begins to be calculated in the entire control unit 121 at step S12. At step S13, the drawing of the second pattern PT2 (a second pattern formation process) begins on the basis of the coordinate value at step S2.

Specifically, at step 14, a coordinate value (a first coordinate value) of the fourth cell CL4 formed by the second pattern PT2 is calculated on the basis of the data input at step S1.

When the coordinate value of the fourth cell CL4 is calculated, the drawing operation is not performed.

The fourth cell CL4 is then drawn at step S15.

At step S15, the fourth cell CL4 is drawn on the basis of the coordinate value calculated at the previous step S14. The remainder of the fourth cell CL4 is thus formed as indicated by reference numeral PT2-4 in FIG. 9B. While the fourth cell CL4 is drawn, the coordinate value of the third cell CL3 formed by the second pattern PT2 is calculated in the entire control unit 121 at step S16. At step S16, the coordinate value of the third cell CL3 is calculated on the basis of the data input at the previous step S1 and the coordinate value calculated at step S14.

The third cell CL3 is then drawn at step S17.

At step S17, the third cell CL3 is drawn on the basis of the coordinate value calculated at the previous step S16. The remainder of the third cell CL3 is formed as indicated by reference numeral PT2-3 in FIG. 9B. While the third cell CL3 is drawn, the coordinate value of the second cell CL2 formed by the second pattern PT2 is calculated in the entire control unit 121 at step S18. At step S18, the coordinate value of the second cell CL2 is calculated on the basis of the data input at the previous step S1 and the coordinate values calculated at steps S14 and S16.

The second cell CL2 is then drawn at step S19.

At step S19, the second cell CL2 is drawn on the basis of the coordinate value calculated at the previous step S18. The remainder of the second cell CL2 is thus formed, as indicated by reference numeral PT2-2 in FIG. 9B. While the second cell CL2 is drawn, the coordinate value of the first cell CL1 formed by the second pattern PT2 is calculated in the entire control unit 121 at step S20. At step S20, the coordinate value of the first cell CL1 is calculated on the basis of the data input at the previous step S1 and the coordinate values calculated at steps S14, S16, and S18.

The first cell CL1 is then drawn at step S21.

At step S21, the first cell CL1 is drawn on the basis of the coordinate value calculated at the previous step S20. The remainder of the first cell CL1 is formed, as indicated by reference numeral PT2-1 in FIG. 9B.

The drawing of the second pattern PT2 is thereby completed.

In the drawing of the second pattern PT2, the remainders of the fourth cell CL4, the third cell CL3, the second cell CL2, and the first cell CL1 are sequentially formed. As described above, the first panel formation region refers to a region that is formed earlier than the second panel formation region in the formation process. Therefore, the fourth cell CL4 refers to the first panel formation region of the invention and the third cell CL3 refers to the second panel formation region of the invention in that the fourth cell CL4 is formed immediately before the third cell CL3. In this case, a coordinate value of the third cell CL3 refers to a second coordinate value of the invention.

Furthermore, the third cell CL3 refers to the first panel formation region of the invention and the second cell CL2 refers to the second panel formation region of the invention in that the third cell CL3 is formed immediately before the second cell CL2. In this case, a coordinate value of the second cell CL2 refers to a second coordinate value of the invention.

Furthermore, the second cell CL2 refers to the first panel formation region of the invention and the first cell CL1 refers to the second panel formation region of the invention in that the second cell CL2 is formed immediately before the first cell CL1. In this case, a coordinate value of the first cell CL1 refers to a second coordinate value of the invention.

As described above, only by forming the first pattern PT1 and the second pattern PT2, can sealant be drawn on each of the cells CL1 to CL4 and a sealing pattern (pattern) be formed to surround each of the cells CL1 to CL4.

Figure 10:
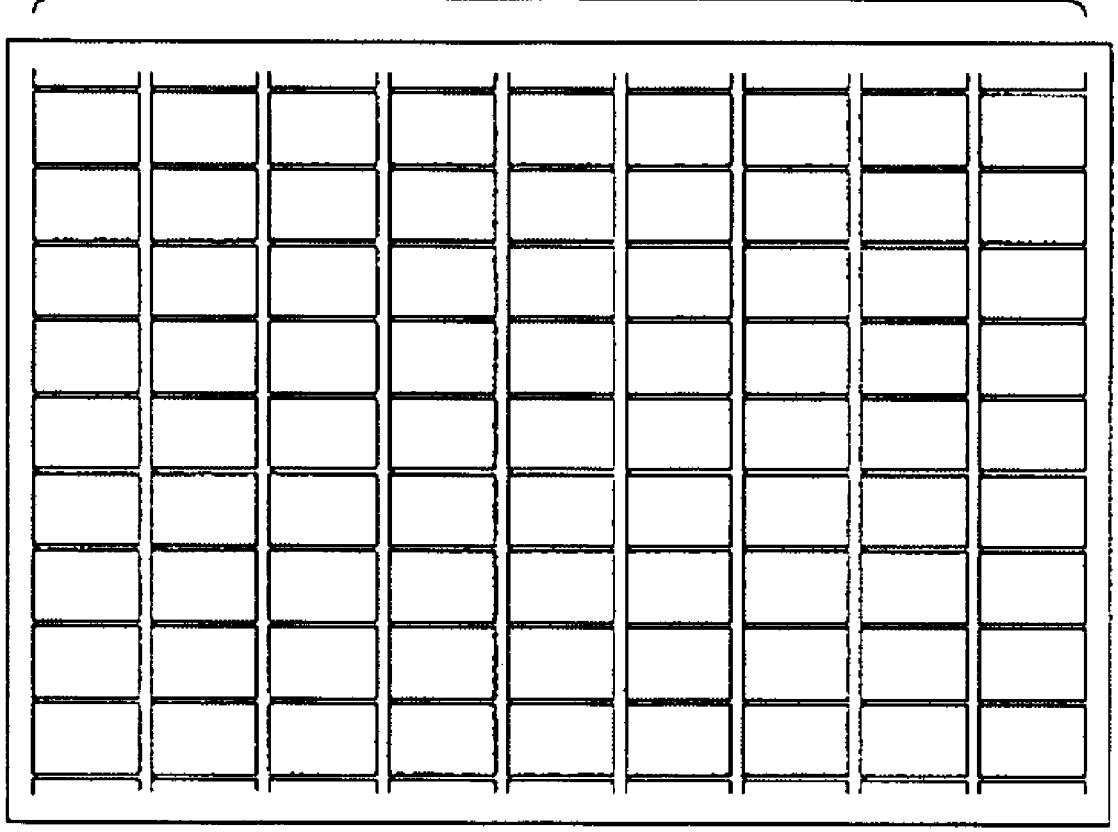
FIG. 10 is a view showing a pattern that is drawn in the sealant drawing method of the invention.

Furthermore, it has been described above that the first pattern PT1 and the second pattern PT2 are formed by using only one dispenser. If a plurality of dispensers is employed, however, a plurality of cell columns as shown in FIGS. 9A and 9B can be formed at the same time. FIG. 10 shows nine cell columns. The sealant drawing apparatus 100 includes three dispensers. Therefore, if the columns are changed three times, the cell columns, as shown in FIGS. 9A and 9B, can be easily formed.

In the present embodiment, it has also been described that the fourth cell CL4 is drawn at step S11. A coordinate value of the fourth cell CL4 of the second pattern PT2 can be calculated while the drawing is being performed. In such a case, after the fourth cell CL4 is drawn by the first pattern PT1, the fourth cell CL4 can be quickly drawn by the second pattern PT2. In addition, when forming the first pattern PT1 and the second pattern PT2, other dispensers can be used. Furthermore, the sealing materials filled into a plurality of dispensers can be different.

In the aforementioned embodiment, it has been described that a coordinate value of the next cell to be drawn is calculated while each cell is drawn. In addition to the above control method, however, a method, in which the coordinates of the entire cells are calculated in a batch manner and the cells are then drawn, can be used.

As described above, in accordance with the present embodiment, since the first pattern PT1 and the second pattern PT2 are continuously drawn in a batch manner in a direction in which a plurality of cells is arranged, drawing can start and end for every column or row of the plurality of cells. This can reduce the number of drawing starts and drawing ends. For this reason, while the sealing materials within the dispensers flow stably, the first pattern PT1 and the second pattern PT2 can be continuously drawn and in a batch manner. It is also possible to draw sealant in a short period of time. In addition, in a single process from the drawing start to the drawing end of a first pattern PT1 and a single process from the drawing start to the drawing end of a second pattern PT2, the dispensers do not need to scan a plurality of cells in a non-discharge state. It is thus possible to prevent sealing materials filled into the dispensers from inadvertently dropping. Therefore, the operation of the dispensers can be simplified and the dispensers can also be easily controlled. It is thus possible to prevent variation in the viscosity or in the discharge amount of sealing materials. In addition, since it is not necessary to take into consideration the variation in the viscosity between lots of the sealing materials, the shape of the sealants can be easily managed. Therefore, the sealants can be drawn easily and quickly, whereby a drawing method having improved productivity can be realized.

In addition, in accordance with the present embodiment, the first pattern PT1 and the second pattern PT2 are drawn in opposite directions. Therefore, bead-shaped drawing pools, which are generated when the drawing begins in the same direction, can be distributed, and a desired cell gap can be obtained accordingly.

Furthermore, in accordance with the present embodiment, a coordinate value of the next cell to be drawn is calculated while each cell is drawn. Therefore, multipoint teaching data are not necessary as compared with the case where all of the coordinates of a plurality of cells are calculated and sealants are discharged on the basis of the calculated coordinates.

Method of Manufacturing Liquid Crystal Device

The sealant drawing method of the above-described embodiment can be employed as one of the processes of the method of manufacturing the liquid crystal device. That is, a conductor pattern, which includes electrodes and wiring lines composed of transparent conductors made of, for example, ITO, is formed on an inner surface of the substrate 10, an orientation film that covers the surface of the conductor pattern is formed, and the same conductor pattern and orientation film as the above conductor pattern and orientation film are also formed on an inner surface of a counter substrate (a second substrate basic material). After the above-mentioned sealant is drawn on the substrate 10 (a sealant drawing process), an adhesive for temporarily fixing is coated on predetermined locations (e.g., several points at the outer edge of the substrate) of the substrate 10 using the adhesive coating unit 111 shown in FIG. 1. Liquid crystal is then dropped within the panel schedule areas (the panel formation regions) 11 (i.e., inside the drawn sealant) using the liquid crystal coating unit 112 (a liquid crystal filling process).

The surroundings of the substrate 10 are then vacuumed or the substrate 10 is introduced into a vacuum chamber that is additionally provided. The counter substrate (not shown) is loaded on the substrate 10 from an upper side. The substrate 10 and the counter substrate are then adhered by using sealant (an adhesion process). The two substrates are compressed by raising the pressure at the surroundings. The substrate 10 and the counter substrate adhered as above-mentioned are then pressurized and positioned. The adhesive for temporary fixing is then cured by UV irradiation, etc. The panel structure of the liquid crystal panel (the large-sized panel in the drawn example) is then completed by performing the process of curing the sealant (UV irradiation, heating process, etc.). The large-sized panel formed as described above is divided into individual liquid crystal panels by a scribe and brake method or the like (a division process).

In the method of manufacturing the liquid crystal device, a liquid crystal injection process and a panel sealing process, which were needed in the related art, are not necessary. Therefore, the number of manufacturing processes can be reduced and the manufacturing efficiency can be improved. Furthermore, in the method of manufacturing the invention, it is necessary to maintain air-tightness of a liquid crystal enclosure region immediately after the substrate 10 and the counter substrate are adhered. Therefore, the coating uniformity of the sealant becomes very important. The drawing method or apparatus according to the present embodiment can obtain uniformity of sealant with high accuracy, and is particularly effective in a method of manufacturing a liquid crystal device, accordingly. In addition, in this manufacturing method, sealant with a high viscosity needs to be used so as to secure air-tightness compared with the related art. Even at this point, it is very effective to use the drawing method or apparatus of the invention, which is desirable for drawing of sealant having a high viscosity. Furthermore, since sealant can be continuously drawn on a plurality of cells in a batch manner, the productivity can be improved and liquid crystal devices can be fabricated at low cost. In addition, liquid crystal devices, which avoid of a defective cell gap and can realize a high quality display, can be fabricated.

In addition, the sealant drawing method, the sealant drawing apparatus, the method of manufacturing the liquid crystal device and the manufacturing apparatus of the liquid crystal device according to the invention are not limited to the above-described examples, but can be modified in various ways without departing from the scope and spirit of the invention. For instance, the method of manufacturing the liquid crystal device is only an example, and can be applied to a method of manufacturing light-emitting devices, inorganic light-emitting devices, plasma display apparatus, electrophoresis apparatus, field emission display devices, Light Emitting Diode (LED) display devices, and the like. Furthermore, the invention can also be applied to a coating process of sealant in a manufacturing method other than the above-described method. The invention can also be widely applied to a variety of sealant drawing processes in addition to the manufacturing process of the liquid crystal device.

The entire disclosure of Japanese Patent Application No. 2004-375689, filed Dec. 27, 2004 is expressly incorporated by reference herein.

What is claimed is:

1. A sealant drawing method for forming a plurality of sealing regions, the method comprising:

forming a first pattern continuously on a substrate to form a first portion of the sealing regions and leaving an opening in each of the sealing regions, the first pattern including first edges of the sealing regions, the first edges extending substantially parallel to each other, and the first edges being formed following a first direction; and forming a second pattern continuously on the substrate after forming the first pattern, the second pattern forming a remaining portion of the plurality of sealing regions by joining to the first portion and closing the openings in each of the sealing regions, the second pattern including second edges of the sealing regions, the second edges being opposite the first edges, the second edges being formed following a second direction that is opposite from the first direction;

wherein the first pattern has a start point and an end point and the second pattern has a start point and an end point, and wherein the start and end points of the first pattern and the start and end points of the second pattern are disposed outside and spaced apart from the sealing regions.

2. The sealant drawing method according to claim 1, wherein the forming the first pattern or the forming the second pattern comprises:

calculating coordinate values for which a sealant is discharged before the sealant is discharged in the sealing regions; and discharging the sealant in the sealing regions on the basis of the coordinate values.

3. The sealant drawing method according to claim 1, wherein the forming the first pattern or the forming the second pattern comprises:

calculating first coordinate values for which a sealant is discharged in a first sealing region of the plurality of sealing regions before the sealant is discharged in the first sealing region; and discharging the sealant in the first sealing region on the basis of the first coordinate values.

4. The sealant drawing method according to claim 3, wherein the forming the first pattern or the forming the second pattern comprises:

calculating second coordinate values for which the sealant is discharged in a second sealing region while the sealant is discharged in the first sealing region; and discharging the sealant in the second sealing region on the basis of the second coordinate values after the sealant is discharged in the first sealing region.

5. The sealant drawing method according to claim 1, wherein the first the first and second patterns are made from different materials from each other.

6. The sealing drawing method according to claim 1, further comprising coupling a countersubstrate to the first substrate after forming the second pattern and after the openings have each been closed by the remaining portions.

7. The sealing drawing method according to claim 1, wherein the first pattern includes a first start branch that includes the start point of the first pattern, wherein the first pattern includes a first end branch that includes the end point of the first pattern, wherein the second pattern includes a second start branch that includes the start point of the second pattern, and wherein the second pattern includes a second end branch that includes the end point of the second pattern, wherein the first start branch and the second end branch extend away from a first end of the plurality of sealing portions, and wherein the first end branch and the second start branch extend away from a second end of the plurality of sealing portions, the first and second ends being opposite each other.

* * * * *